United States Patent
Hung

(10) Patent No.: US 10,153,756 B2
(45) Date of Patent: Dec. 11, 2018

(54) METHOD FOR SIGNAL TRANSMISSIONS VIA A PATH THROUGH WHICH ELECTRICAL POWER IS TRANSMITTED, AND SIGNAL TRANSMISSION SYSTEM

(71) Applicant: AMTB Technology, Kaohsiung (TW)

(72) Inventor: Yu-Cheng Hung, Kaohsiung (TW)

(73) Assignee: AMTB TECHNOLOGY, Kaohsiung (TW)

( * ) Notice: Subject to any disclaimer, the term of this patent is extended or adjusted under 35 U.S.C. 154(b) by 363 days.

(21) Appl. No.: 15/247,603

(22) Filed: Aug. 25, 2016

(65) Prior Publication Data

US 2017/0063356 A1  Mar. 2, 2017

(30) Foreign Application Priority Data

Aug. 31, 2015 (TW) .............................. 104128617 A

(51) Int. Cl.
| | |
|---|---|
| *H02J 3/00* | (2006.01) |
| *H03K 5/1252* | (2006.01) |
| *H04B 3/56* | (2006.01) |
| *H04B 3/58* | (2006.01) |
| *H03H 7/38* | (2006.01) |

(52) U.S. Cl.
CPC ............. *H03K 5/1252* (2013.01); *H04B 3/56* (2013.01); *H04B 3/58* (2013.01); *H03H 7/38* (2013.01)

(58) Field of Classification Search
USPC ............................................................ 307/1
See application file for complete search history.

(56) References Cited

U.S. PATENT DOCUMENTS

| | | | |
|---|---|---|---|
| 5,635,826 A | 6/1997 | Sugawara | |
| 6,897,764 B2 | 5/2005 | Cern | |
| 2006/0202640 A1 | 9/2006 | Alexandrov | |
| 2011/0222595 A1* | 9/2011 | Choi | ...................... H04B 3/548 |
| | | | 375/238 |

FOREIGN PATENT DOCUMENTS

| | | |
|---|---|---|
| CN | 101667488 A | 3/2010 |
| JP | 2009164795 A | 7/2009 |
| TW | 201351903 A | 12/2013 |

* cited by examiner

*Primary Examiner* — Rexford Barnie
*Assistant Examiner* — Dru Parries
(74) *Attorney, Agent, or Firm* — Hamre, Schumann, Mueller & Larson, P.C.

(57) ABSTRACT

A signal transmission system includes a switch component and a choke component each coupled to one of a first power wire and a second power wire, a first conductive path between the switch component and a load, a second conductive path between the choke component and the load, and a control block. The control block controls the switch component to not conduct when providing a control signal to the first and/or second conductive paths. When the switch component does not conduct, a magnetic core of the choke component does not reach magnetic saturation. When the switch component conducts, the magnetic core of the choke component operates at magnetic saturation.

17 Claims, 7 Drawing Sheets

METHOD FOR SIGNAL TRANSMISSIONS VIA A PATH THROUGH WHICH ELECTRICAL POWER IS TRANSMITTED, AND SIGNAL TRANSMISSION SYSTEM

CROSS-REFERENCE TO RELATED APPLICATION

This application claims priority of Taiwanese Patent Application No. 104128617, filed on Aug. 31, 2015.

FIELD

The disclosure relates to a signal transmission method, and more particularly to a method for transmitting a control signal to a load via a path through which electrical power is transmitted, and a signal transmission system using the same.

BACKGROUND

Power line communication (PLC) techniques employ widely distributed electrical wiring to perform control of electrical devices. However, conventional PLC techniques may have drawbacks such as poor compatibility with the electrical devices, poor immunity to noise interference from the electrical devices, high power consumption, noise and/or distortion that may occur with a long transmission distance, etc.

SUMMARY

Therefore, an object of the disclosure is to provide a method and a signal transmission system for signal transmission via a path through which electrical power is transmitted. The method may alleviate at least one of the drawbacks of the prior art.

The method includes steps of: connecting electrically a first terminal of a switch component to one of a first power wire and a second power wire that cooperatively transmit electrical power, and building a first conductive path between a second terminal of the switch component and a load; connecting electrically a first terminal of a choke component to another one of the first power wire and the second power wire, and building a second conductive path between a second terminal of the choke component and the load; and controlling the switch component to not conduct, and providing a control signal through at least one of the first and second conductive paths for controlling operation of the load. The choke component has a magnetic core having a magnetic hysteresis characteristic that corresponds to a magnetic hysteresis curve such that: when the switch component does not conduct, the control signal induces a current that flows through the choke component and that does not cause the magnetic core to reach magnetic saturation; and when the switch component conducts, the electrical power induces a current that flows through the choke component and that causes the magnetic core to operate at magnetic saturation.

According to the disclosure, the signal transmission system includes a switch component, a choke component, a first conductive path, a second conductive path and a control block. The switch component has a first switch terminal disposed to be electrically coupled to one of a first power wire and a second power wire that cooperatively transmit electrical power, and a second switch terminal. The choke component has a first choke terminal disposed to be electrically coupled to another one of the first power wire and the second power wire, a second choke terminal, and a magnetic core. The first conductive path is disposed to electrically couple the second switch terminal to a first power terminal of a load. The second conductive path is disposed to electrically couple the second choke terminal to a second power terminal of the load. The control block is electrically coupled to the first and second conductive paths for providing a control signal to at least one of the first and second conductive paths for control operation of the load, is electrically coupled to the switch component, and is configured to control the switch component to not conduct when providing the control signal. The control signal induces a current smaller than that induced by the electrical power. The magnetic core of the choke component has a magnetic hysteresis characteristic corresponding to a magnetic hysteresis curve such that: when the switch component does not conduct, the control signal induces a current that flows through the first choke component and that does not cause the first magnetic core to reach magnetic saturation; and when the switch component conducts, the electrical power induces a current that flows through the choke component and that causes the first magnetic core to operate at magnetic saturation.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
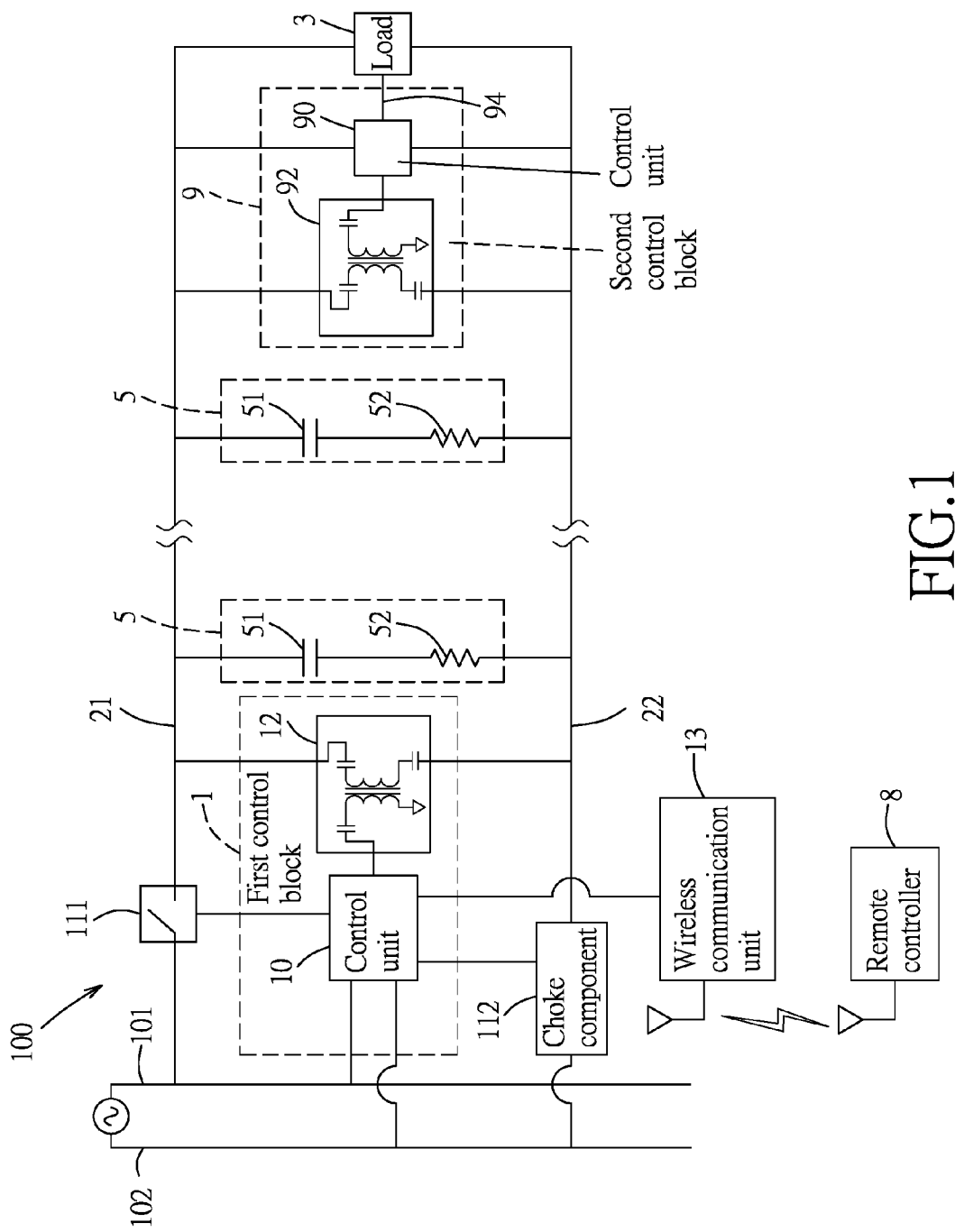
FIG. 1 is a circuit block diagram illustrating an embodiment of a signal transmission system according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
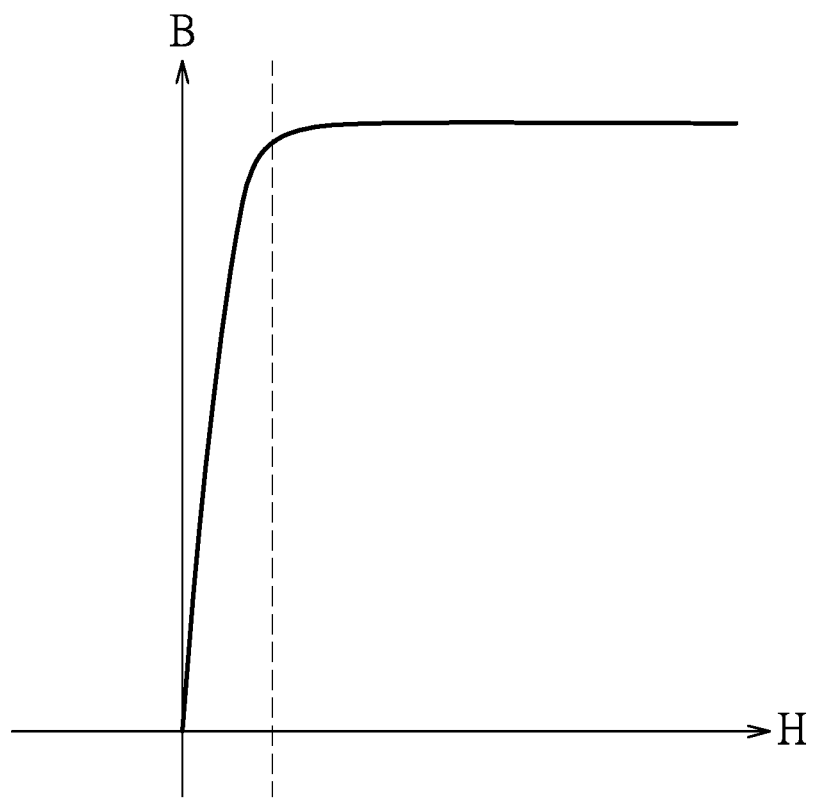
FIG. 2 is a plot illustrating a part of a magnetic hysteresis curve of a magnetic core.
Figure 3:
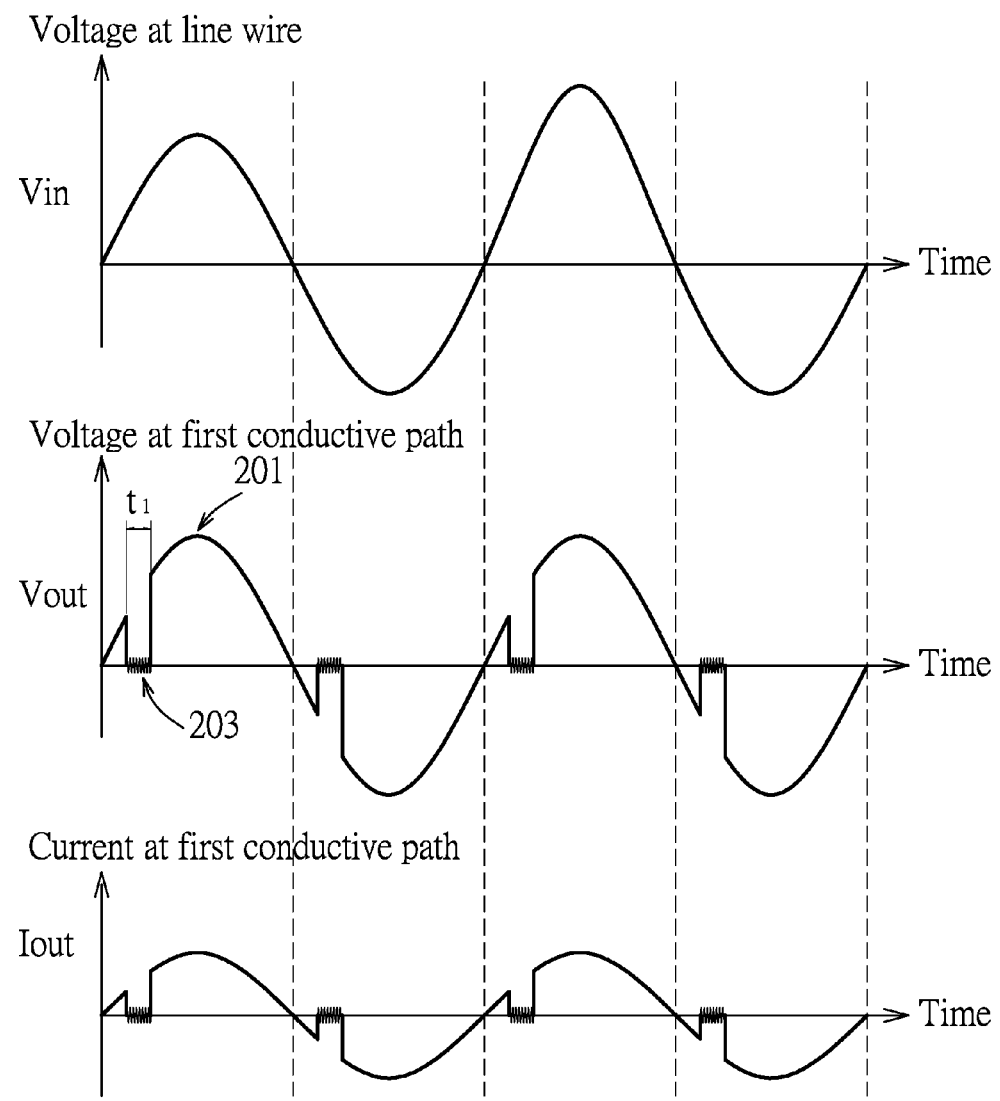
FIG. 3 shows waveforms illustrating transmission of electrical power and a control signal using the embodiment.

Referring to FIGS. 1 to 3, the embodiment of this disclosure is shown to use a signal transmission system 100 to implement a method for signal transmission via a path through which electrical power is transmitted. In this embodiment, the signal transmission system 100 is adapted for industrial monitoring and control, but this disclosure is not limited thereto.

The signal transmission system 100 includes a switch component 111, a choke component 112, a first control block 1 that includes a control unit 10 (e.g., a processor, a microcontroller, etc.) and a coupling component 12, a second control block 9, a first conductive path 21 which is a first wire in this embodiment, a second conductive path 22 which is a second wire substantially parallel to the first wire in this embodiment, two impedance matching units 5 and a wireless communication unit 13. The second control block 9 includes a control unit 90 (e.g., a processor, a microcontroller, etc.), a coupling component 92 coupled to the control unit 90 and the first and second conductive paths 21, 22, a control interface 94 coupled to a load 3 (e.g., an electrical device such as a street light) for controlling operation of the load 3, and a power output having a pair of power output terminals respectively coupled to a pair of power terminals of the load 3 for transmitting electrical power received from the conductive paths 21, 22 thereto. In this embodiment, the switch component 111 is electrically coupled to a first power wire 101 using a first switch terminal thereof, and the choke component 112 is electrically coupled to a second power wire 102 using a first choke terminal thereof, but the disclosure is not limited thereto. In other embodiments, the switch component 111 may be electrically coupled to the second power wire 102, and the choke component 112 may be electrically coupled to the first power wire 101. The first power wire 101 and the second power wire 102 are electrically coupled to a power source and cooperatively transmit to the signal transmission system 100 electrical power that is provided by the power source. In this embodiment, the power source is an alternating-current (AC) power source, and the first and second power wires 101, 102 may be respectively a line wire and a neutral wire that are coupled to the AC power source to cooperatively transmit AC electrical power. In other embodiments, the power source may be a direct-current (DC) power source, and the first and second power wires 101, 102 may be wires that are respectively coupled to positive and negative/ground terminals of the DC power source to cooperatively transmit DC electrical power.

The first conductive path 21 electrically couples a second switch terminal of the switch component 111 to one power terminal of the load 3.

The second conductive path 22 electrically couples a second choke terminal of the choke component 112 to another power terminal of the load 3.

The wireless communication unit 13 is electrically coupled to the control unit 10, and is configured to receive a wireless signal provided by a remote controller 8. The control unit 10 generates a control signal 203 (see FIG. 3) based on a control command included in the wireless signal, and provides the control signal 203 to at least one of the first and second conductive paths 21, 22 through the coupling component 12 by coupling, so as to transmit the control signal 203 for controlling operation of the load 3. In one embodiment, the control signal may be a differential signal that is transmitted using both of the first and second conductive paths 21, 22. The control unit 90 receives the control signal 203 through the coupling component 92, and controls operation of the load 3 based on the control signal 203 through the control interface 94. It is noted that the signal transmission system 100 may be adapted for connection with multiple loads, each being coupled between the first and second conductive paths 21, 22, and having a corresponding second control block 9. However, only one load 3 and one second control block 9 are illustrated in FIG. 1 for the sake of clarity. In some embodiments, Ethernet technologies may be used to enable the wireless communication unit 13 to receive the control command from a network. In some embodiments, the wireless communication unit 13 may be replaced by a wired communication unit, and the disclosure is not limited thereto.

Referring to FIGS. 1 and 2, the choke component 112 has a magnetic core (not shown) that has a magnetic hysteresis characteristic corresponding to a magnetic hysteresis curve (i.e., B-H curve). For the sake of clarity, FIG. 2 exemplifies only a portion of the magnetic hysteresis curve having a non-saturation region and a saturation region which are separated using a dotted line. In this embodiment, the choke component 112 may be a saturable reactor with the magnetic core having a high magnetic permeability (e.g., $\mu_r$=20000 H/m). When the control unit 10 provides the control signal 203 (see FIG. 3), the control unit 10 controls the switch component 111 to not conduct, causing a current that is provided from the power source and that flows into the load 3 to be zero. On the other hand, a current induced by the control signal 203 is so small that the magnetic core of the choke component 112 will operate around an origin of the magnetic hysteresis curve and will not reach magnetic saturation even if the magnetic core has no air gap and thus a high magnetic permeability. Non-saturation of the magnetic core causes the choke component 112 to have a high impedance to isolate the control signal 203 from the electrical power originating from the power source (i.e., not permitting transmission of the control signal to the second power wire 102, so as to prevent leakage of the control signal to the second power wire 102, which may adversely affect signal transmission quality), thereby achieving good transmission quality for the control signal 203. Referring to FIGS. 1 to 3, when the switch component 111 conducts, the control unit 10 stops provision of the control signal 203, and a large current that is caused by the electrical power 201 and that flows through the first and second conductive paths 21, 22 causes the magnetic core of the choke component 112 to generate a large magnetic field, leading to magnetic saturation of the magnetic core and causing the choke component 112 to permit passage of the electrical power 201 provided by the power source; and when the switch component 111 does not conduct (e.g., a time period $t_1$ in FIG. 3), a small current induced by the control signal 203 cannot make the magnetic core of the choke component 112 reach magnetic saturation, so the choke component 112 has high impedance, isolating the control signal 203 from the electrical power provided on the first power wire 101 and the second power wire 102. In this embodiment, the switch component 111 may be a solid state relay with a current rating of around 20 A. In an experiment of the embodiment, when the switch component 111 conducts, inductance of the choke component 112 whose magnetic core reaches magnetic saturation is approximately zero. When the switch component 111 does not conduct, the inductance of the choke component 112 is about several milli-henries (mH). It is noted that, in conventional PLC techniques, the control signal must be transmitted around a zero-crossing point of the electrical power to achieve better signal quality, but the signal quality of the control signal 203 in this disclosure can be ensured even if a duration in which the switch component 111 does not conduct and the control signal 203 is transmitted is not around the zero-crossing point of the electrical power (i.e., the switch component 111 is controlled to not conduct during a time period throughout which a voltage at the first power wire 101 is not zero).

Figure 4:
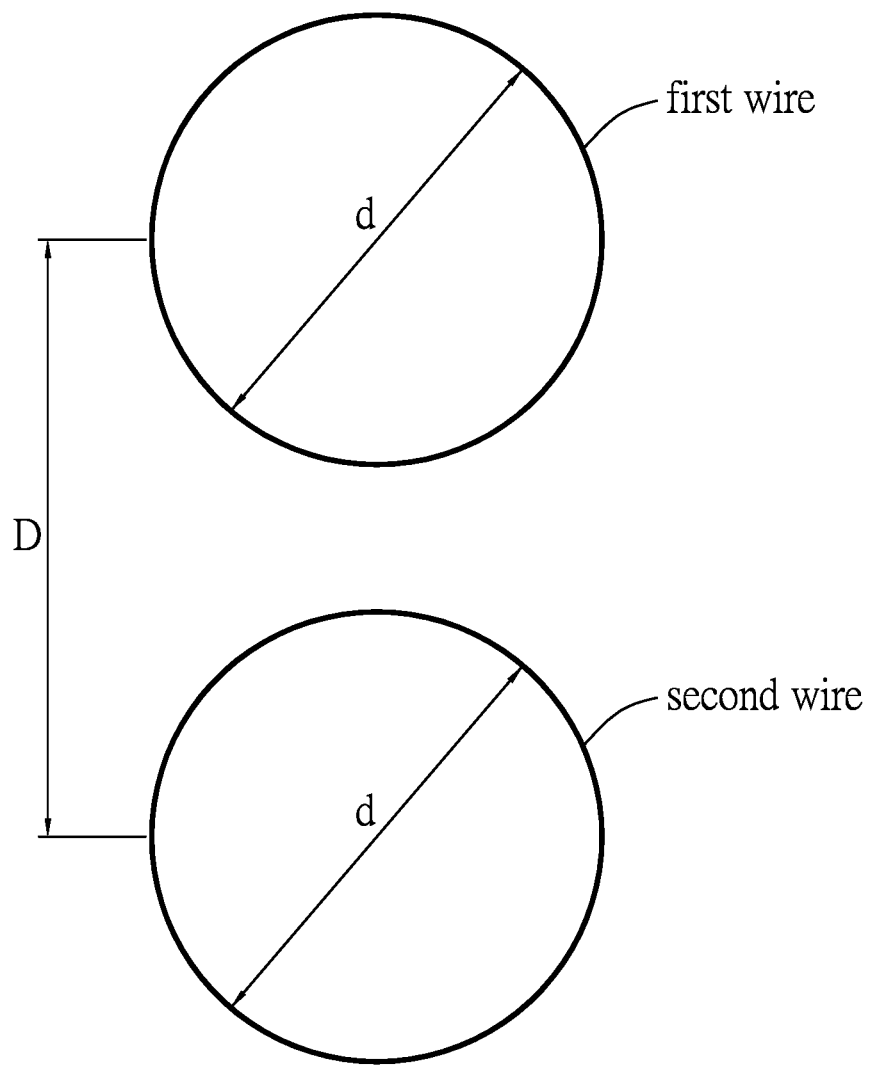
FIG. 4 is a schematic diagram illustrating a distance between two wires and a wire diameter.

The impedance matching units 5 are disposed between and respectively proximate to the first and second control blocks 1, 9. Each of the impedance matching units 5 includes a capacitor 51 and a resistor 52 electrically coupled in series between the first and second conductive paths 21, 22. Further referring to FIG. 4, the resistor 52 of each impedance matching unit 5 has an open wire line impedance/resistance (i.e., characteristic impedance of a parallel-wire transmission line) of $$120 \ln \frac{2D}{d},$$

where D represents a distance between core parts of the first and second wires (i.e., the first and second conductive paths 21, 22 in this embodiment), and d represents a diameter of each of the first and second wires. By virtue of the impedance matching units 5, distortion of the control signal 203 may be alleviated.

Referring to FIGS. 1 and 3, in this embodiment, each of the first and second conductive paths 21, 22 is longer than a distance that may cause the control signal 203 to form a standing wave. In one exemplary application, when the control signal 203 has a frequency of about 200 kHz, a quarter wave length thereof in a wire is about 250 meters. When a distance for which the control signal 203 is to be transmitted (i.e., a length of the first and/or second conductive paths 21, 22) is longer than 250 meters, it is suitable to use the impedance matching units 5 to alleviate signal distortion resulting from the standing wave.

Figure 5:
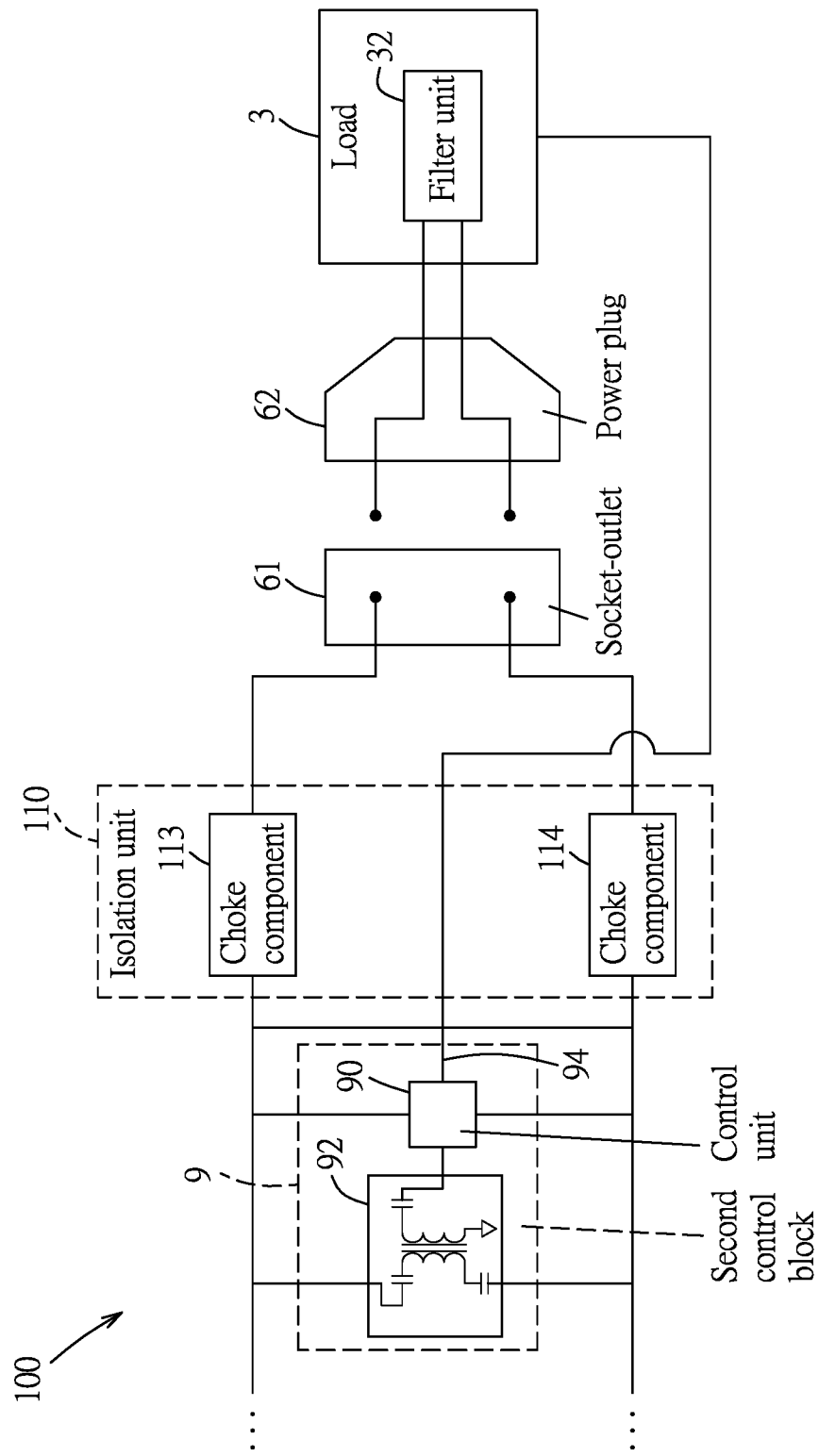
FIG. 5 is a circuit block diagram illustrating use of an isolation unit in the embodiment.

Referring to FIGS. 1, 3 and 5, in a case that the load 3 includes a filter unit 32, the signal transmission system 100 may further include an isolation unit 110 that is coupled between the second control block 9 and the filter unit 32 and that is configured to isolate the control signal 203 from interference caused by the load 3 (e.g., noise that results from discharging of the load 3 to the conductive paths 21, 22 when the switch component 111 does not conduct) during transmission of the control signal 203 on the first and/or second conductive paths 21, 22 (e.g., the time period $t_1$ in FIG. 3 in which the switch component 111 does not conduct), and to prevent the control signal 203 from being filtered out by the filter unit 32 when being transmitted to the second control block 9. The filter unit 32 may have low electromagnetic interference (EMI), high electromagnetic susceptibility (EMS), or qualified electromagnetic compatibility (ENC) that has both low EMI and high EMS. In this embodiment, the isolation unit 110 includes two choke components 113, 114, each of which may be a saturable reactor having characteristics similar to those of the choke component 112 (see FIG. 1). Each of the choke components 113, 114 is electrically coupled between a respective power output terminal of the second control block 9 and a respective power terminal of the load 3, and has a magnetic core. The magnetic core of each of the choke components 113,114 has a respective magnetic hysteresis characteristic corresponding to a respective magnetic hysteresis curve such that: when the magnetic core operates around an origin of the respective magnetic hysteresis curve and does not reach magnetic saturation, the corresponding choke component 113, 114 has high impedance to block passage of the control signal, thereby preventing the control signal from being filtered out by the filter unit 32; and when the magnetic core operates at magnetic saturation, the corresponding choke component 113, 114 permits passage of the electrical power 201, and the control signal 203 is not provided at this time. In one implementation, the choke components 113, 114 may be jointly formed by double winding around a bigger magnetic core (i.e., the choke components 113, 114 share the same magnetic core).

In this embodiment, the magnetic core of each of the choke components 113, 114 has a magnetic permeability $\mu_r$ of 20000 H/m, a diameter of between 1.5 cm and 2 cm, and is wound around with about five turns of windings having a wire diameter of 2 mm to form the choke component 113, 114 having the inductance of several milli-henries (mH). Such a size enables the choke components 113, 114 to be installed within either a socket-outlet 61 or a power plug 62, but the disclosure is not limited thereto. On the other hand, choke components used in conventional PLC techniques are required to keep magnetic cores thereof operating in the non-saturation region even if a current of, for example, 20 A flows therethrough. The conventional choke components that are available on the market and that meet such requirements may have a large dimension (e.g., $10 \times 15 \times 7$ cm$^3$) and a heavy weight (e.g., about 3 kgw).

In some applications where the first and second conductive paths 21, 22 are not parallel to each other (i.e., a distance therebetween varies), characteristic impedance thereof may be different at different wiring portions, thereby adversely affecting signal quality. In such a case, a repeater block 7 may be used as shown in FIGS. 6 and 7.

Figure 6:
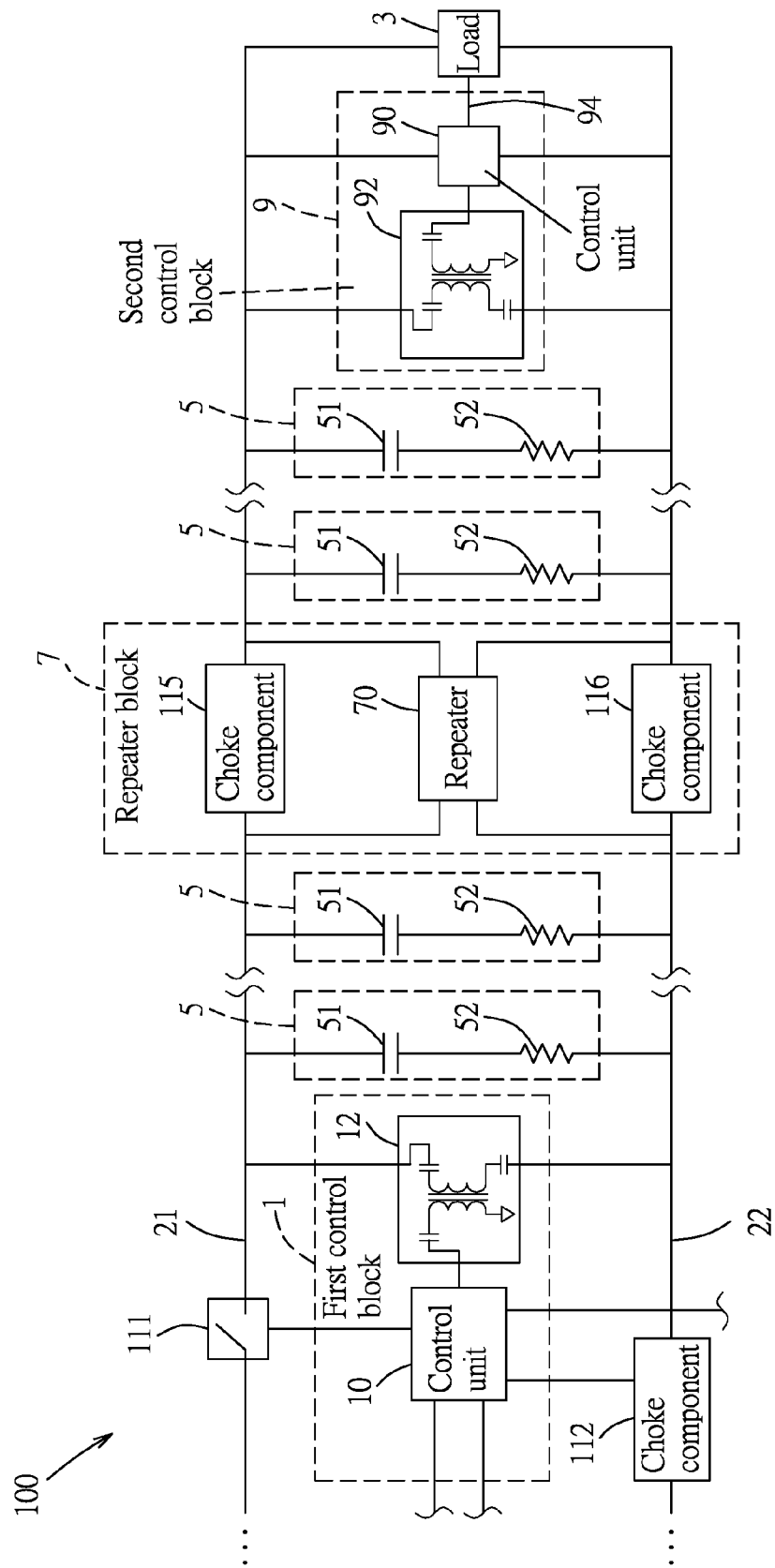
FIG. 6 is a circuit block diagram illustrating use of a one-to-one repeater in the embodiment.

Referring to FIG. 6, when a distance between the first control block 1 and the second control block 9 is so long that the control signal 203 (see FIG. 3) received by the second control block 9 may have a serious distortion with direct wire connection, the signal transmission system 100 may further include a repeater block 7 between the first and second control blocks 1, 9, and two additional impedance matching units 5 coupled to the first and second conductive paths 21, 22, one between the first control block 1 and the repeater block 7 and proximate to the repeater block 7, and the other between the second control block 9 and the repeater block 7 and proximate to the repeater block 7. The repeater block 7 includes a one-to-one repeater 70, and two choke components 115, 116 that are respectively coupled between a first segment and a second segment of the first conductive path 21, and between a first segment and a second segment of the second conductive path 22. The repeater block 7 is configured to retransmit the control signal 203 received from at least one of the first segments of the conductive paths 21, 22 to at least one of the second segments of the conductive paths 21, 22, or vice versa (in a case that the second control block 9 can transmit signals to the first control block 1). Each of the choke components 115, 116 is similar to the choke component 112 (see FIG. 1), and has a magnetic core that has a respective magnetic hysteresis characteristic corresponding to a respective magnetic hysteresis curve such that: when the magnetic core operates around an origin of the respective magnetic hysteresis curve and does not reach magnetic saturation, the corresponding choke component 115, 116 has high impedance to block passage of the control signal; and when the magnetic core operates at magnetic saturation, the corresponding choke component 115, 116 permits passage of the electrical power, and the control signal 203 is not provided at this time. In one implementation, the choke components 115, 116 may be jointly formed by double winding around a bigger magnetic core (i.e., the choke components 115, 116 share the same magnetic core).

Figure 7:
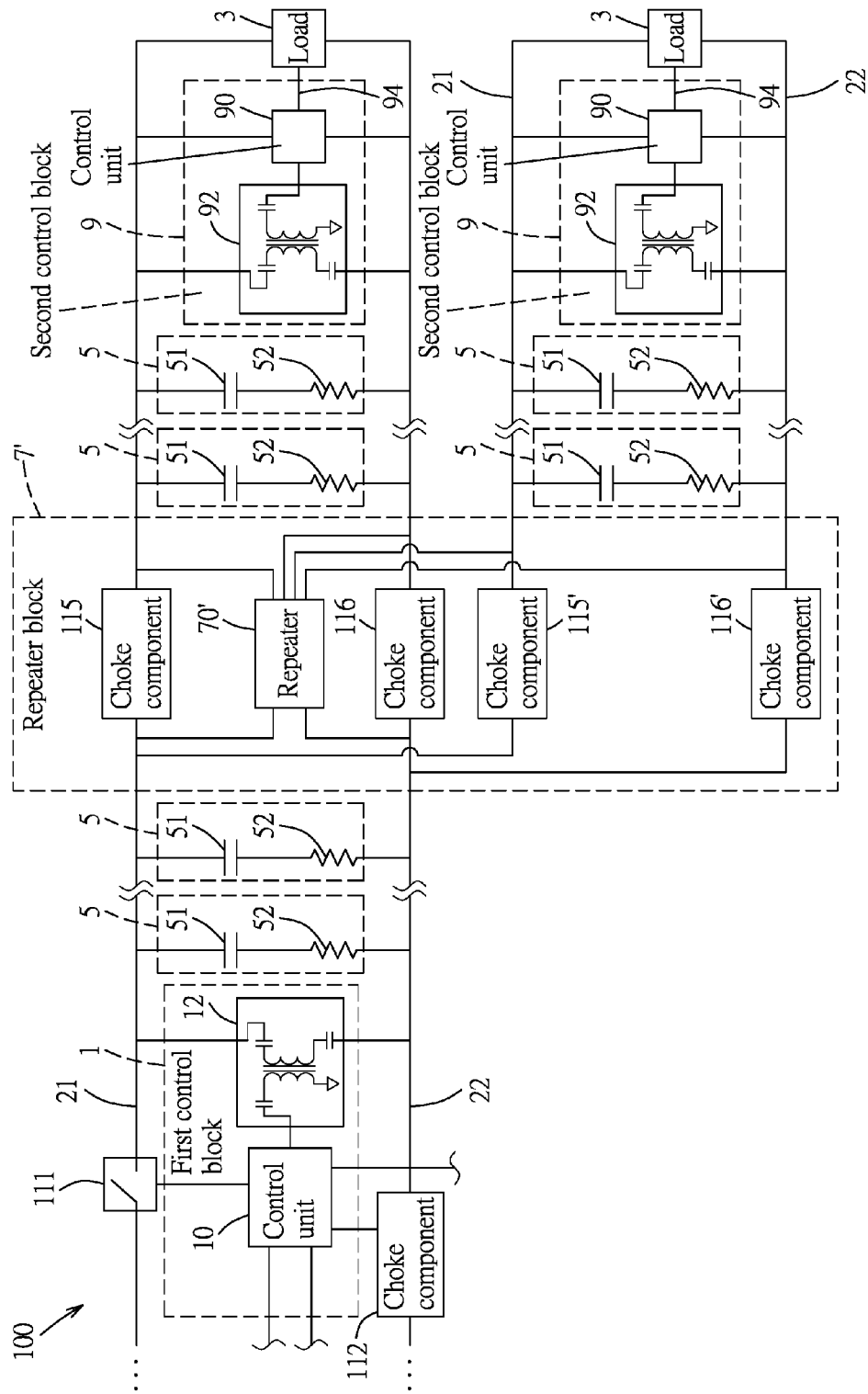
FIG. 7 is a circuit block diagram illustrating use of a one-to-many repeater in the embodiment.

FIG. 7 shows another application of a repeater block 7', which includes a one-to-many repeater 70' adapted for multiple loads. In detail, another load 3, along with another second control block 9, is electrically coupled to the load 3 and the second control block 9 in parallel. The repeater block 7' further includes choke components 115', 116' for the another load 3 and the another second control block 9. In this case, the signal transmission system 100 further includes two additional impedance matching units 5 coupled to the first and second conductive paths 21, 22 between the repeater block 7 and the another second control block 9, and respectively proximate to the repeater block 7' and the another second control block 9.

It is noted that, the applications shown in FIGS. 6 and 7 may also include the aforementioned isolation unit 110, socket outlet 61 and power plug 62, and each of the aforementioned choke components 112-116 has a magnetic permeability greater than or equal to 1000 H/m.

In summary, the disclosure may have the following advantages:

1. The choke component 112 with the magnetic core having the magnetic hysteresis characteristic is properly cooperated with the switching operation of the switch component 111 to effectively ensure good quality of transmission of the control signal 203.

2. The signal transmission system 100 uses the isolation unit 110 at an output end thereof, thereby preventing the control signal 203 from being filtered out by the load 3, and isolating the control signal 203 from interference caused by the load 3.

3. By virtue of the impedance matching units 5, distortion of the control signal 203 that results from long distance transmission may be alleviated.

4. The signal transmission system 100 may include the repeater block 7 to further ensure signal quality in long distance transmission. In addition, the repeater block 7 may use the one-to-many repeater 70', thereby ensuring signal quality for multiple loads.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A method for signal transmission via a path through which electrical power is transmitted, said method comprising steps of:
   connecting electrically a first terminal of a switch component to one of a first power wire and a second power wire that cooperatively transmit electrical power, and building a first conductive path between a second terminal of the switch component and a load;
   connecting electrically a first terminal of a choke component to another one of the first power wire and the second power wire, and building a second conductive path between a second terminal of the choke component and the load; and
   controlling the switch component to not conduct, and providing a control signal through at least one of the first and second conductive paths for controlling operation of the load;
   wherein the choke component has a magnetic core having a magnetic hysteresis characteristic that corresponds to a magnetic hysteresis curve such that: when the switch component does not conduct, the control signal induces a current that flows through the choke component and that does not cause the magnetic core to reach magnetic saturation; and when the switch component conducts, the electrical power induces a current that flows through the choke component and that causes the magnetic core to operate at magnetic saturation.

2. The method of claim 1, further comprising a step of: controlling the switch component to conduct, and stopping the provision of the control signal to the load.

3. The method of claim 1, wherein the electrical power is an alternating-current (AC) electrical power, and the switch component is controlled to not conduct during a time period throughout which a voltage at the first power wire is not zero.

4. A signal transmission system comprising:
   a switch component having a first switch terminal disposed to be electrically coupled to one of a first power wire and a second power wire that cooperatively transmit electrical power, and a second switch terminal;
   a first choke component having a first choke terminal disposed to be electrically coupled to another one of the first power wire and the second power wire, a second choke terminal, and a first magnetic core;
   a first conductive path disposed to electrically couple said second switch terminal to a first power terminal of a load;
   a second conductive path disposed to electrically couple said second choke terminal to a second power terminal of the load; and
   a first control block electrically coupled to said first and second conductive paths for providing a control signal to at least one of said first and second conductive paths for controlling operation of the load, electrically coupled to said switch component, and configured to control said switch component to not conduct when providing the control signal;
   wherein said first magnetic core has a magnetic hysteresis characteristic corresponding to a magnetic hysteresis curve such that: when said switch component does not conduct, the control signal induces a current that flows through said first choke component and that does not cause said first magnetic core to reach magnetic saturation; and when said switch component conducts, the electrical power induces a current that flows through said first choke component and that causes said first magnetic core to operate at magnetic saturation.

5. The signal transmission system of claim 4, the load including a filter unit that has the first and second power terminals, said signal transmission system further comprising:
   a second control block electrically coupled to said first and second conductive paths for receiving therefrom the electrical power and the control signal, having a power output at which the electrical power is outputted, and having a control interface to be electrically coupled to the load for controlling operation of the load according to the control signal; and
   an isolation unit disposed to electrically couple said power output of said second control block to the first and second power terminals of the load, and configured to isolate the control signal from interference caused by the load during transmission of the control signal on said at least one of said first and second conductive paths, and to prevent the control signal from being filtered out by the filter unit.

6. The signal transmission system of claim 5, wherein:
said power output of said second control block includes a first power output terminal electrically coupled to said first conductive path, and a second power output terminal electrically coupled to said second conductive path;
said isolation unit includes: a second choke component that is disposed to electrically couple said first power output terminal to the first power terminal, and that has a second magnetic core; and a third choke component that is disposed to electrically couple said second power output terminal to the second power terminal, and that has a third magnetic core; and
each of said second and third magnetic cores has a respective magnetic hysteresis characteristic corresponding to a respective magnetic hysteresis curve such that: when one of said second and third magnetic cores does not reach magnetic saturation, a corresponding one of said second and third choke components blocks passage of the control signal therethrough, and when the one of said second and third magnetic cores operates at magnetic saturation, the corresponding one of said second and third choke components permits passage of the electrical power.

7. The signal transmission system of claim 6, further comprising a socket-outlet within which said second and third choke components are disposed.

8. The signal transmission system of claim 6, further comprising a power plug within which said second and third choke components are disposed.

9. The signal transmission system of claim 6, wherein said second and third magnetic cores are one and the same.

10. The signal transmission system of claim 4, wherein said first conductive path includes a first path segment and a second path segment, and said second conductive path includes a first path segment and a second path segment;
said first path segments of said first and second conductive paths being electrically coupled to said second switch terminal and said second choke terminal, respectively, and being electrically coupled to said first control block for receiving the control signal therefrom;
said second path segments of said first and second conductive paths being disposed to be electrically coupled to the first and second power terminals of the load, respectively;
said signal transmission system further comprising a repeater block including:
a first input terminal and a second input terminal electrically coupled to said first path segments of said first and second conductive paths, respectively;
a first output terminal and a second output terminal electrically coupled to said second path segments of said first and second conductive paths, respectively;
a second choke component electrically coupled between said first and second path segments of said first conductive path, and having a second magnetic core;
a third choke component electrically coupled between said first and second path segments of said second conductive path, and having a third magnetic core; and
a repeater electrically coupled to said first path segments of said first and second conductive paths, coupled to said second path segments of said first and second conductive paths, and configured to retransmit the control signal that is received from at least one of said first path segments of said first and second conductive paths to at least one of said second path segments of said first and second conductive paths;
wherein each of said second and third magnetic cores has a respective magnetic hysteresis characteristic corresponding to a respective magnetic hysteresis curve such that: when one of said second and third magnetic cores does not reach magnetic saturation, a corresponding one of the second and third choke components blocks passage of the control signal therethrough, and when the one of said second and third magnetic cores operates at magnetic saturation, the corresponding one of the second and third choke components permits passage of the electrical power.

11. The signal transmission system of claim 10, further comprising a plurality of impedance matching units each including a capacitor and a resistor electrically coupled in series,
wherein said impedance matching units include a first impedance matching unit and a second impedance matching unit that are electrically coupled respectively between said first path segments of said first and second conductive paths, and between said second path segments of said first and second conductive paths, and that are disposed proximate to said repeater block.

12. The signal transmission system of claim 11, wherein said impedance matching units further include a third impedance matching unit that is electrically coupled between said first path segments of said first and second conductive paths and that is disposed proximate to said first control block, and a fourth impedance matching unit that is electrically coupled between said second path segments of said first and second conductive paths, and that is disposed proximate to said second control block.

13. The signal transmission system of claim 10, wherein said second and third magnetic cores are one and the same.

14. The signal transmission system of claim 4, further comprising:
a second control block electrically coupled to said first and second conductive paths for receiving therefrom the electrical power and the control signal, having a power output at which the electrical power is outputted, and having a control interface to be electrically coupled to the load for controlling operation of the load according to the control signal;
a first impedance matching unit including a capacitor and a resistor that are electrically coupled in series between said first and second conductive paths, and being disposed between said first and second control blocks and proximate to said first control block; and
a second impedance matching unit including a capacitor and a resistor that are electrically coupled in series between said first and second conductive paths, and being disposed between said first and second control blocks and proximate to said second control block.

15. The signal transmission system of claim 14, wherein said first conductive path is a first wire that has a core part, said second conductive path is a second wire that has a core part and that is parallel to said first wire, and said resistor of each of said first and second impedance matching units has a resistance of $$120 \ln\frac{2D}{d},$$

where D represents a distance between said core parts of said first and second wires, and d represents a diameter of each of said first and second wires.

16. The signal transmission system of claim 4, wherein said first magnetic core of said first choke component has a magnetic permeability equal to or greater than 1000 H/m.

17. The signal transmission system of claim 4, wherein said first control block is further configured to stop the provision of the control signal when controlling said switch component to conduct.

* * * * *